United States Patent [19]

Iwata et al.

[11] Patent Number: 5,043,942
[45] Date of Patent: Aug. 27, 1991

[54] NAND CELL TYPE PROGRAMMABLE READ-ONLY MEMORY WITH COMMON CONTROL GATE DRIVER CIRCUIT

[75] Inventors: Yoshihisa Iwata; Masaki Momodomi, both of Yokohama; Yasuo Itoh, Kawasaki; Tomoharu Tanaka, Yokohama; Hideko Odaira, Tokyo, all of Japan

[73] Assignee: Kabushiki Kaisha Toshiba, Kawasaki, Japan

[21] Appl. No.: 532,627

[22] Filed: Jun. 4, 1990

[30] Foreign Application Priority Data

Aug. 31, 1989 [JP] Japan .................. 1-225429

[51] Int. Cl.⁵ ............................................ G11C 13/00
[52] U.S. Cl. ............................... 365/185; 365/189.01
[58] Field of Search .................. 365/182, 185, 189.01, 365/189.04, 230.01

[56] References Cited

U.S. PATENT DOCUMENTS 4,233,526 11/1980 Kurogi et al. ........................ 365/184
4,677,590 6/1987 Arakawa ............................... 365/185
4,694,314 9/1987 Terada et al. ........................ 365/185

FOREIGN PATENT DOCUMENTS 0134390 10/1981 Japan ............................. 365/189.05

Primary Examiner—Terrell W. Fears
Attorney, Agent, or Firm—Oblon, Spivak, McClelland, Maier & Neustadt, P.C.

[57] ABSTRACT

A NAND cell type EEPROM has a substrate, parallel bit lines formed above the substrate, and a memory cell section including an array of NAND type cell units associated with the same corresponding bit line. Each of the NAND type cell units has a series-circuit of eight data storage transistors and at least one selection transistor. Each data storage transistor has a floating gate for storing carriers injected thereinto by tunneling and a control gate respectively connected to word lines. A control gate driver circuit is provided in common for all the NAND type cell units that are assisted with the same bit line. Transfer gates are connected between the common driver circuit and the NAND cell units.

14 Claims, 14 Drawing Sheets

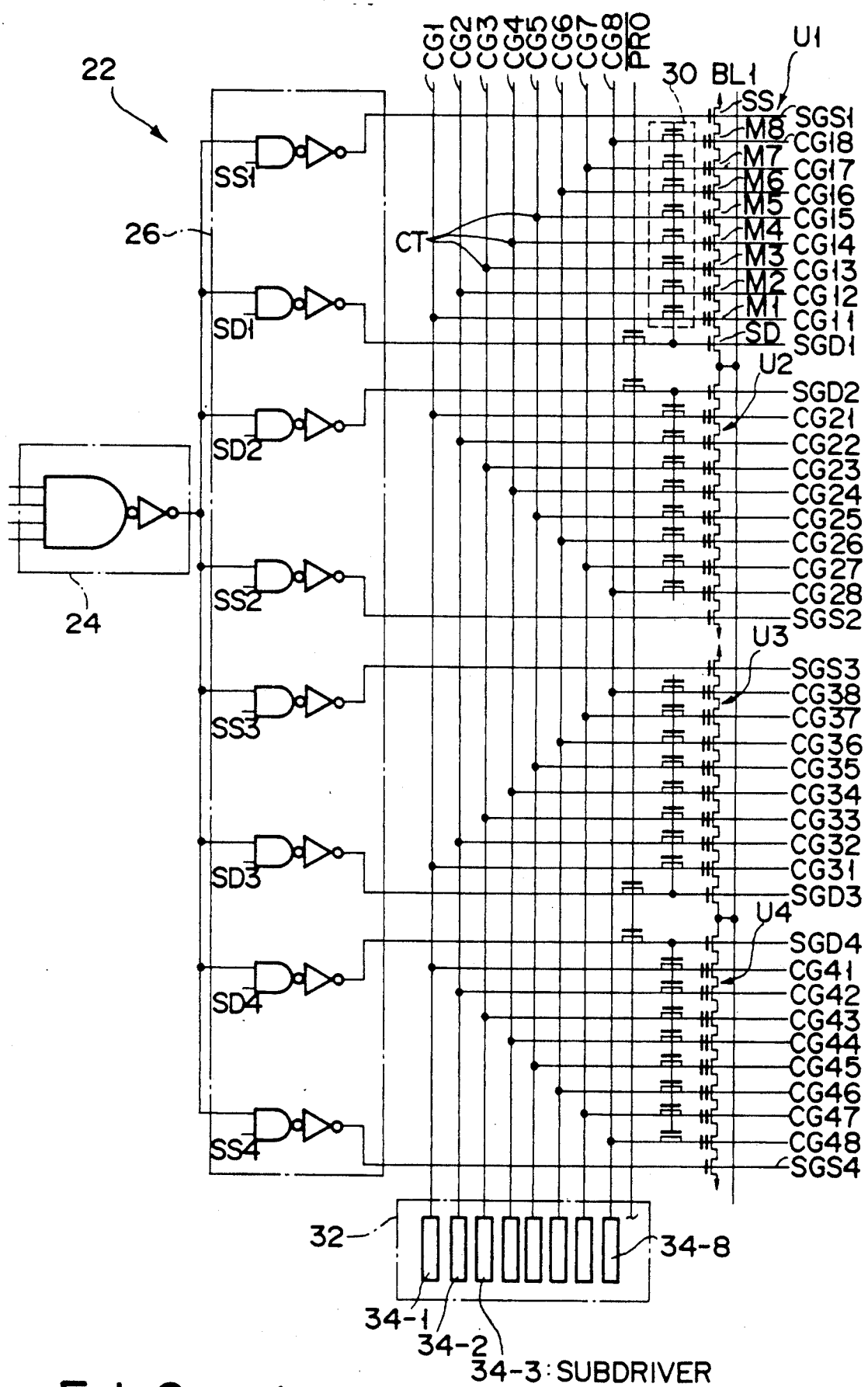
F I G. 1

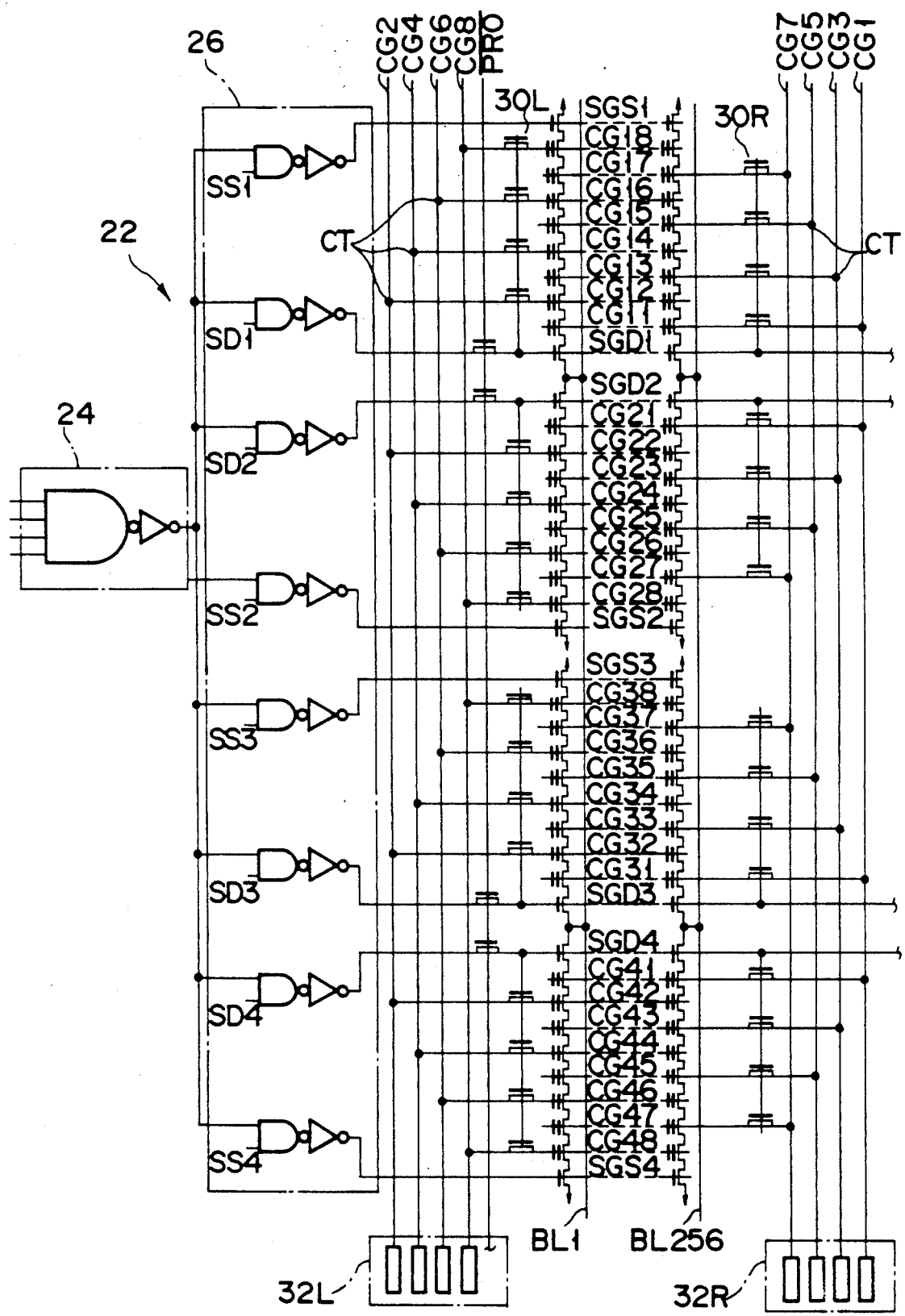
F I G. 6

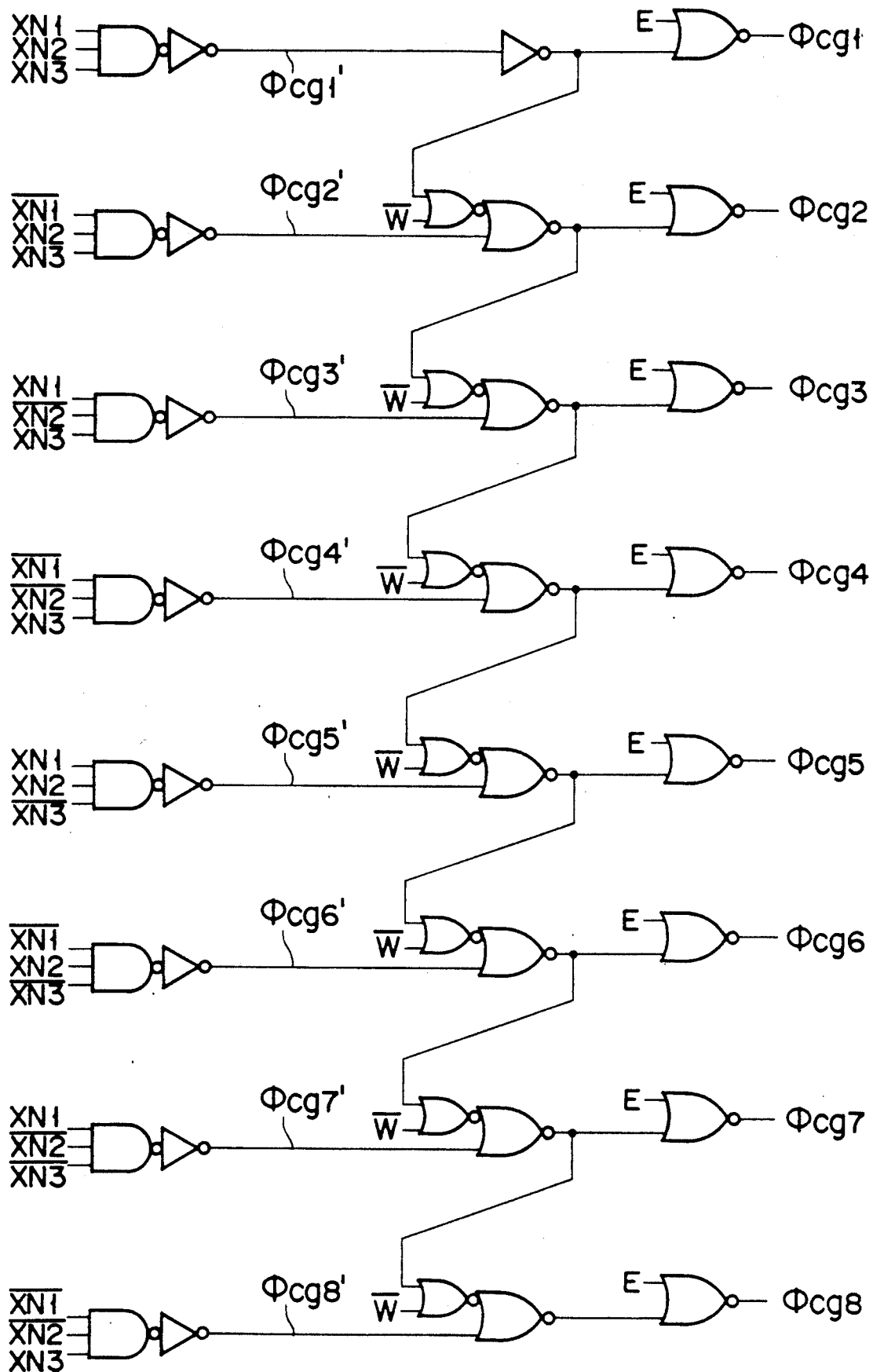
F I G. 9

NAND CELL TYPE PROGRAMMABLE READ-ONLY MEMORY WITH COMMON CONTROL GATE DRIVER CIRCUIT

BACKGROUND OF THE INVENTION

1. Field of the Invention

The present invention relates to a non-volatile semiconductor memory device with electrically rewritable memory cells each having a carrier storage layer provided between a semiconductor substrate and a control gate.

2. Description of the Related Art

A semiconductor memory device having MOSFET structure type memory cells with floating gates or MNOS structure type memory cells capable of data writing and electrically erasing operations have been known widely as the electrically erasable programmable read-only memory, or "EEPROM," for short. The memory array of such kind of EEPROM may be constituted by arranging memory cells so that these cells are respectively positioned at crossing points between parallel row lines and parallel column lines to provide a matrix cell arrangement. In a presently available EEPROM, drains of every two neighboring memory cells are formed together as a common drain layer, with which a corresponding column line is in electrically contact, thereby to decrease the necessary cell area on a chip substrate. With such an arrangement, however, the total integration density of memory cells in EEPROM cannot be improved as highly as required, since the electrical contact section still occupies relatively large part of the chip substrate.

Recently, an advanced EEPROM has been proposed which has memory cell units each of which consists of a series array of a preselected number of data storage transistors. Such memory cell units are called the "NAND type cell" or "NAND cell unit." With the NAND cell arrangement, the contact sections can be decreased in number greatly. The effective memory area can thus be increased to improve the total integration density of EEPROM.

The NAND cell type EEPROM, however, still suffers from insufficiency in large-capacity data storage performance, for the following reasons. In the conventional NAND type EEPROM, driver circuits are respectively connected with control gate lines, also known as the "word lines," of memory cell transistors in each NAND cell unit. The control gate drive circuit in the NAND cell type EEPROM is more complicated and larger in size than the conventional EEPROM. This is because data writing and erasing operations in this EEPROM are not so simple as in the conventional EEPROM. Complicated data accessing scheme requires high-performance control gate drive circuit configuration, which is naturally increased in size. Increasing in size of the control gate drive circuit will cause the effective memory area on the chip substrate to be decreased, even if the NAND cell arrangement is utilized in order to decrease the contact sections in the memory cells. As a result, it cannot be expected that the memory integration density is enhanced even in the NAND cell type EEPROM.

SUMMARY OF THE INVENTION

It is therefore an object of the present invention to provide a new and improved nonvolatile semiconductor memory device with NAND cell structure which is high in the memory integration density.

In accordance with the above objects, the present invention is addressed to a specific a non-volatile semiconductor device which comprises a substrate, parallel data transmission lines formed above said substrate, a memory cell section, and a control gate driver circuit. The memory section includes an array of NAND type cell units that are associated with a corresponding one of the data transmission lines. Each of the NAND type cell units has a series-circuit of a preselected number of data storage transistors and a switching transistor. The data storage transistors have carrier storage layers and control gates, respectively. The switching transistor has a selection gate and is provided between the series-circuit of data storage transistors and a corresponding data transmission line. The control gate driver circuit is formed on the substrate and provided in common for a plurality of certain NAND type cell units specified from among the NAND type cell units associated with the corresponding data transmission line.

Other and further objects of this invention will become obvious upon an understanding of the illustrative embodiment about to be described or will be indicated in the appended claims, and various advantages not referred to herein will occur to one skilled in the art upon employment of the invention in practice.

BRIEF DESCRIPTION OF THE DRAWINGS

In the detailed description of a preferred embodiments of the present invention presented below, reference is made to the accompanying drawings in which:

FIG. 1 is a circuit diagram showing the main part of a NAND type electrically erasable programmable read-only memory in accordance with one preferred embodiment of the present invention;

FIG. 6 is a circuit diagram showing the main part of a NAND type electrically erasable programmable read-only memory in accordance with another embodiment of the present invention;

FIG. 9 is a diagram showing the equivalent circuit configuration of a control gate drive circuit that is preferably used to operate in accordance with the first possible data accessing method;

DETAILED DESCRIPTION OF THE PREFERRED EMBODIMENTS

Figure 2:
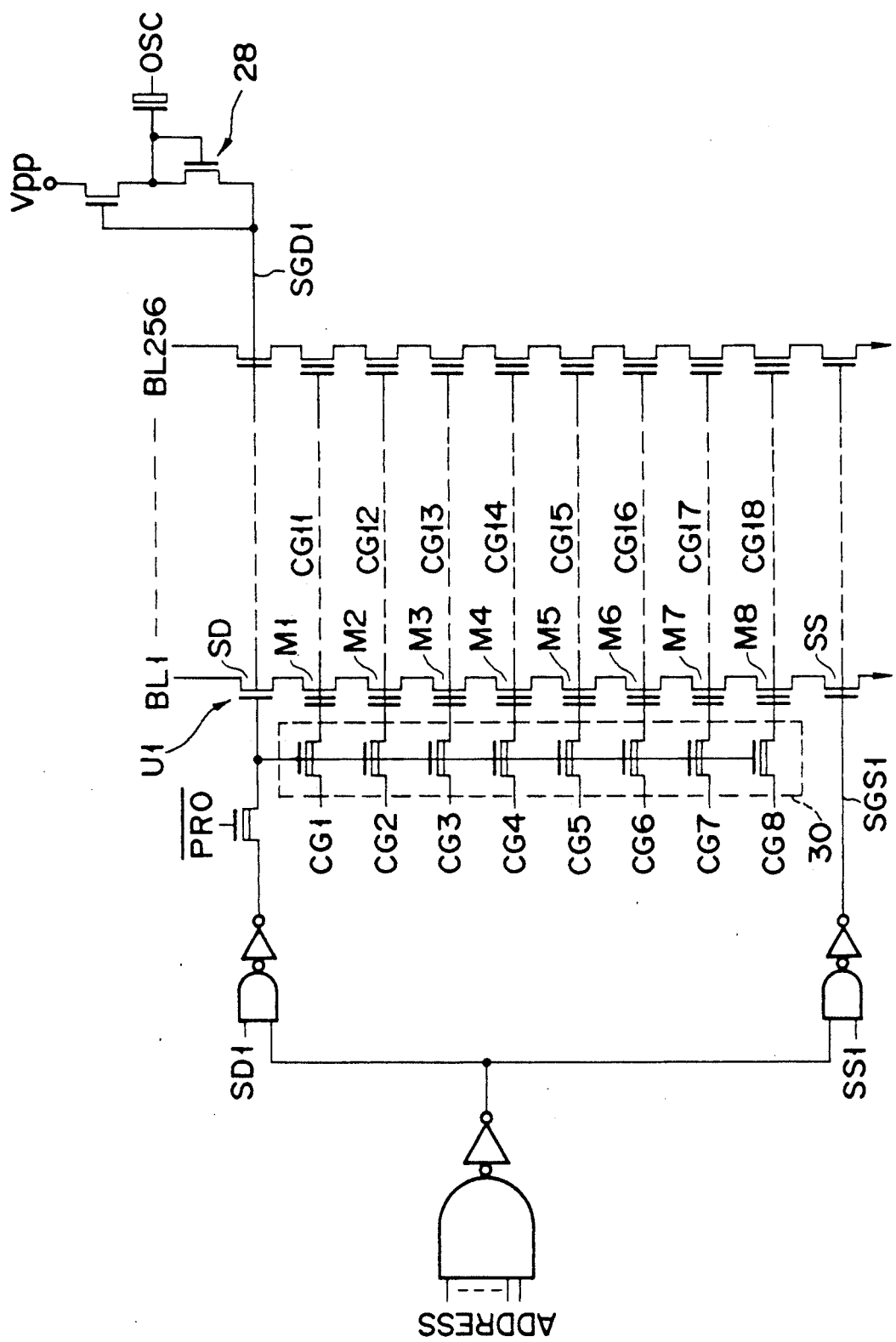
FIG. 2 is a diagram showing the internal circuit configuration of one of the NAND cell units of the EEPROM shown in FIG. 1.

Referring now to FIG. 1, a NAND cell type electrically erasable programmable read-only memory (EEPROM) in accordance with one preferred embodiment of the present invention has on a semiconductor substrate (which will be described later with reference to FIG. 3) a preselected number of NAND cell units U associated with a certain bit line BL1, that is one of a specific number of, 256, for example, parallel bit lines BL in the EEPROM. Only four NAND cell units U1, U2, U3, and U4 are shown in FIG. 1 for the purpose of simplification of illustration in the drawing.

As shown in FIG. 2, NAND cell unit Ui (i=1, 2, 3, ..., n; 1, for example) has a series-circuit of eight data storage transistors M1 to M8 called "memory cell transistor," or "cell transistor," in such a manner that sources of every two adjacent cell transistor Mi and M(i+1) are formed together in one common source layer, and that drains of every two adjacent cell transistor Mi and M(i+1) are made of one common drain layer.

NAND cell unit U1 has two selection transistors SD and SS. The series-circuit of cell transistors M1 to M8 is connected at one end to the corresponding bit line BL1 via selection transistor SD, when transistor SD is rendered conductive. The series-circuit of cell transistors M1 to M8 is connected at the other end to the ground potential via selection transistor SS, when transistor SS is turned on. It is to be noted that the number of series-connected cell transistors may be modified such as four, sixteen, or the like, as required.

Memory cell transistors M in NAND cell unit U1 may be metal oxide semiconductor field effect transistors (MOSFETs) each having a control gate and a floating gate that is insulatively disposed above lightly-doped p type (p-) type substrate 20. The control gates of cell transistors M1, M2, ..., M8 are respectively coupled with parallel conductive wiring lines CG11, CG12, ..., CG18, called the "control gate lines." These control gate lines CG may function as the "word lines" in the EEPROM.

Selection transistors SD and SS may be MOSFETs without floating gates. These control gates of selection transistors SD and SS are coupled with conductive selection gate lines SGD1 and SGS1, respectively. Selection gate lines SGD1 and SGS1 are parallel with control gate lines CG.

As shown in FIG. 1, selection gate line SGD1 that is positioned at the drain of cell transistor M1 in NAND cell unit U1 is connected to one of the output terminals of row decoder section 22 via a transfer gate, which is comprised of a depression type (D type, for short) MOS transistor. Selection gate line SGS1 that is positioned at the source of cell transistor M8 is connected in direct to a corresponding one of the output terminals of row decoder section 22. (The selection gate lines of the remaining NAND cell units U2, U3, and U4 are essentially same as in unit U1; the detailed description will thus be omitted.) Row decoder section 22 includes main row decoder circuit 24 and sub-row decoder circuit 26. Selection gate line SGD1 is also connected with voltage boost circuit 28 as shown in FIG. 2. This circuit 28 serves to generate a specific voltage of increased voltage potential level as required, which will be supplied to selection gate line SGD1 a high-level voltage in data write mode and data erase mode of EEPROM.

Control gate drive circuit 32 is provided in common for the NAND cell units U1, U2, ... associated with the same bit line B11. Control gate lines CG11, CG12, ..., CG18 of NAND cell unit U1 are connected to output lines CG1, CG2, ..., CG8 (see FIG. 2) of control gate drive circuit 32 via transfer gate array 30 consisting of D type MOSFETs. Control gate lines CG21, CG22, ..., CG28 of NAND cell unit U2 are connected to output lines CG1, CG2, ..., CG8 (see FIG. 2) of control gate drive circuit 32 via a transfer gate array consisting of D type MOSFETs. The same is true for the remaining NAND cell units 3 and 4 shown in FIG. 1. Very importantly, the corresponding control gate lines of different NAND cell units U1, U2, U3, U4, e.g., lines CG11, CG21, ..., CG41, are connected together to the same output line CG1 via different transfer gate arrays respectively. In this sense circuit 32 will be referred to as "common control gate driver" hereinafter in this description.

It is clear from viewing FIG. 1 that common control gate driver 32 is positioned not along the parallel control gate lines of NAND cell units U, but rather in a peripheral region of the NAND cell units U. "Common" output lines CG are formed in a substrate surface region that is defined between row decoder section 22 and bit lines BL; they run in parallel with bit lines BL of EEPROM to enter common control gate driver 32. Common control gate driver 32 includes a specific number of subdriver units 34: the number corresponds to the number of control gate lines CGi1 to CGi8 of cell transistors M1 to M8 in each NAND cell unit Ui. Common control gate output lines CG1 to CG8 are thus connected with subdrivers 34-1, 34-2, ..., 34-8, respectively.

More specifically, output line CG1 of subdriver unit 34-1 is connected in common with control gate lines CG11, CG21, CG31, and CG41. Similarly, output line CG2 of subdriver unit 34-2 is connected in common with control gate lines CG12, CG22, CG32, and CG42. Transfer gate array 30 is provided with respect to each NAND cell unit Ui, for selectively connecting each of the control gate lines CGi1, CGi2, ..., CGi8 to the corresponding one of the output lines CG. MOSFETs of transfer gate array 30 are connected at their gates to the corresponding selection gate line SGDi which is connected to the control gate of selection transistor SD in NAND cell Ui; transfer gate array 30 may be controlled by selection gate line SGDi.

Figure 3:
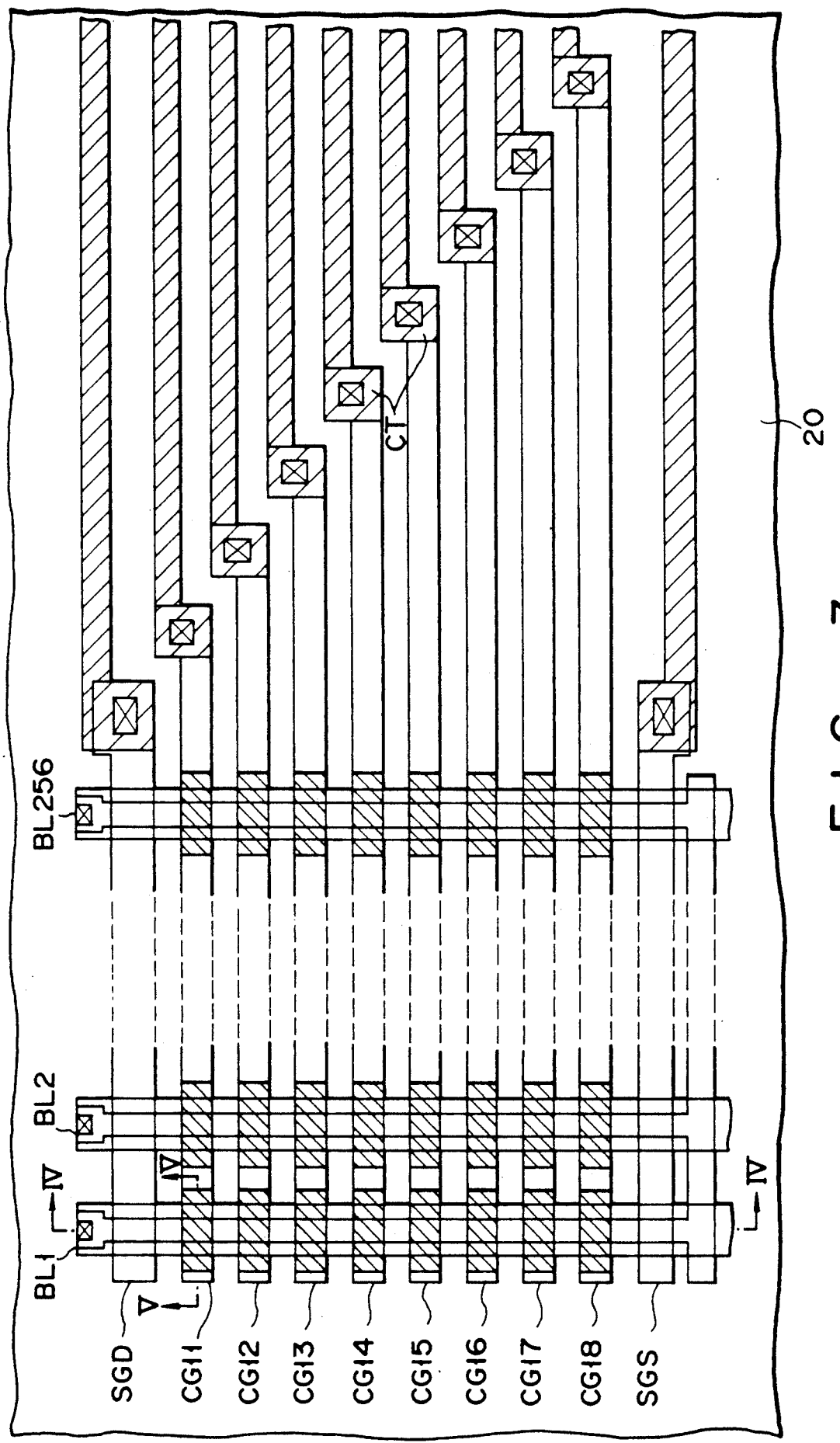
FIG. 3 is a diagram showing the practical plan view of the patterning layout of the NAND cell units shown in FIG. 1.
Figure 4:
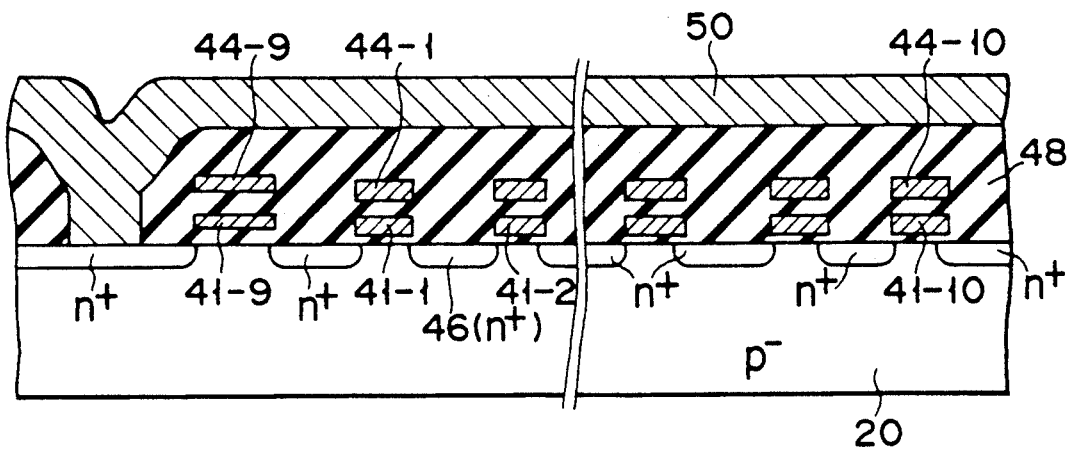
FIG. 4 is a diagram showing the cross-sectional view of a NAND cell unit of FIG. 3 taken along line IV—IV.
Figure 5:
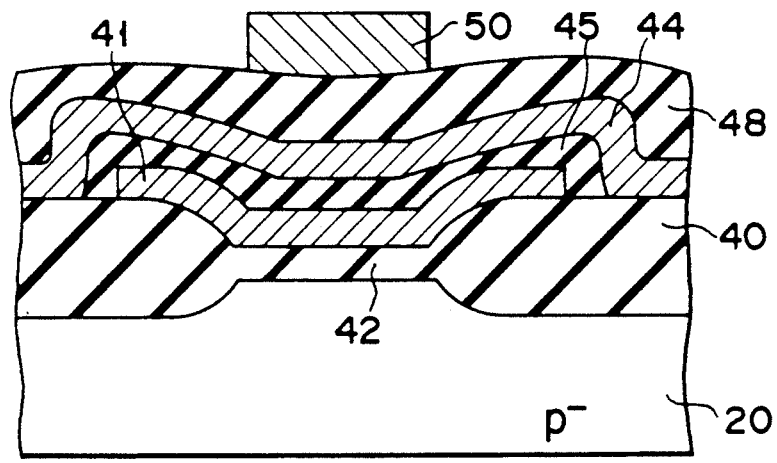
FIG. 5 is a diagram showing the cross-sectional view of the NAND cell unit of FIG. 3 taken along line V—V.

The plan view of 256 NAND cell units U1 to U256 associated with bit lines B11 to BL256 is shown in FIG. 3. Cross-sectional views along line IV—IV and V—V are shown in FIGS. 4 and 5, respectively. Insulative layer 40 acting as elements isolation layer is formed on substrate 20, which may be a lightly-doped p type (p-type) silicon substrate. First gate insulation thin-film 42 is formed on substrate 20 as shown in FIG. 5; it serves as a tunneling insulation layer. First polycrystalline silicon thin-film 41 is formed on first gate insulation thin-film 42 as the floating gate layer of a corresponding memory cell transistor Mi. Second gate insulation thin-film 45 is formed to cover floating gate layer 41; second polycrystalline silicon thin-film 44 is formed on second gate insulation thin-film 45 as the control gate layer of the cell transistor Mi.

In the manufacturing process of EEPROM, after such multi-layered data storage transistor structure is obtained, impurities are doped in the structure so that heavily-doped n type (n+type) semiconductor layers 46 serve as the sources and drains of series-connected cell transistors M1 to M8, as shown in FIG. 4.

Regarding selection transistors SD and SS, these transistors have the similar double-layered polycrystalline gate structure to those in the memory cell transistors M: it differs from the memory cell transistors in that the lower polycrystalline layer, e.g., the first polycrystalline thin-film, is not subjected to the patterning for the formation of floating gates in cell transistors M, and therefore remains as it is.

After the memory cell transistors of all the NAND cell units in EEPROM are fabricated, the chip substrate 20 is entirely covered with CVD insulation thin-film 48. Subsequently, CVD insulation thin-film 48 is subjected to the patterning process so that contact holes are formed in CVD insulation thin-film 48. Alminum wiring layers 50 are formed on the top surface of CVD insulation thin-film 48; they are electrically connected to the drain of selection transistor SD so as to serve as the bit lines BL.

Figure 7:
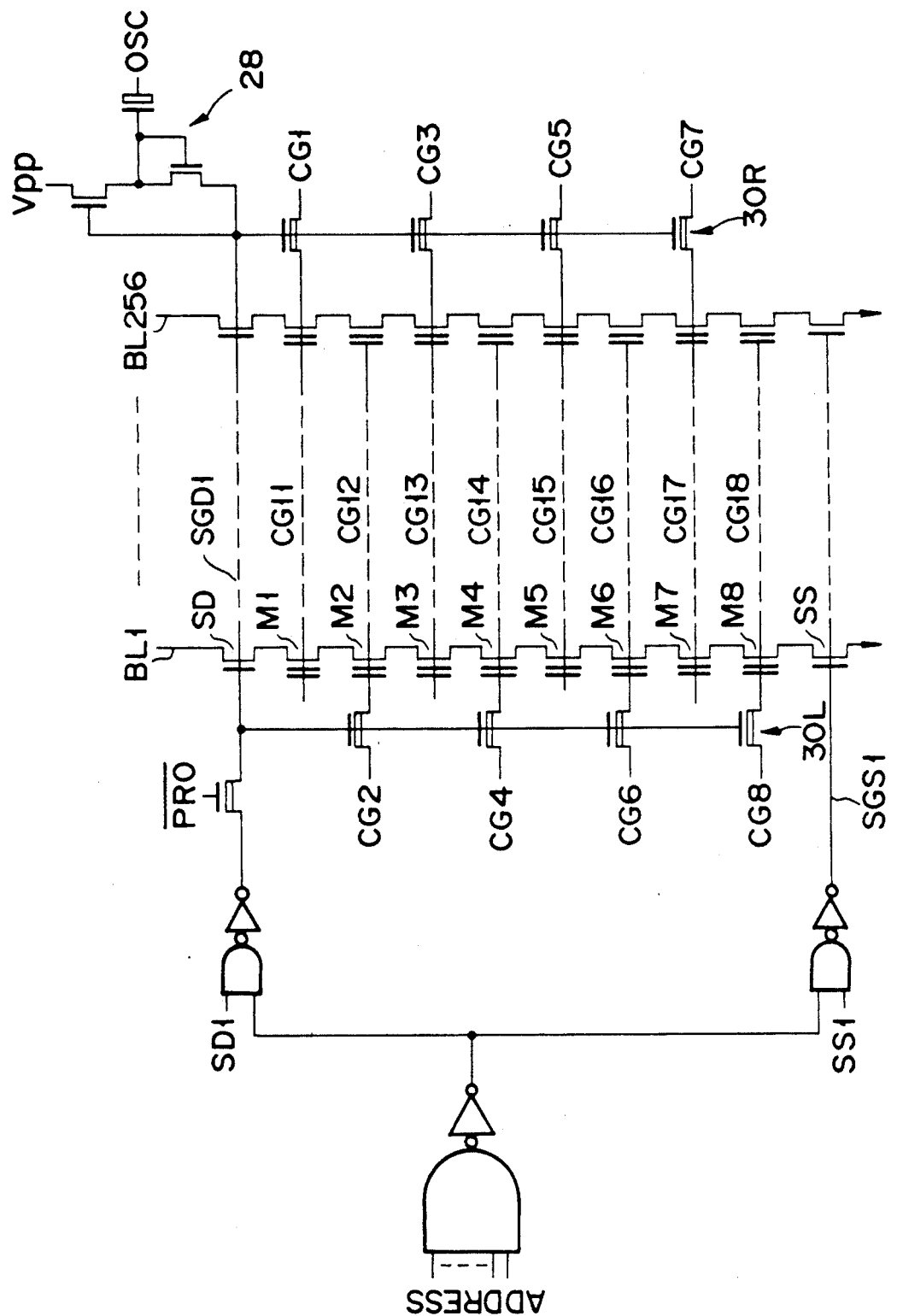
FIG. 7 is a diagram showing the internal circuit configuration of one of the NAND cell units of the EEPROM shown in FIG. 6.

The aforementioned circuit configuration of NAND cell type EEPROM of the present invention may be modified as shown in FIGS. 6 and 7: these figures are equivalent circuit diagrams that are illustrated in a correspondence manner as in FIGS. 1 and 2.

This EEPROM is featured in that "common" control gate driver 32 is subdivided into two sections: right-side driver section 32R and left-side driver section 32L, wherein suffixes "R" and "L" stand for "right" and "left," respectively. These two driver sections 32R and 32L are positioned on the opposite sides of a memory section containing NAND cell units U as shown most clearly in FIG. 6. Each one of driver sections 32R and 32L includes four subdriver units 34, since each NAND cell unit Ui consists of eight memory cell transistors M1 to M8 also in this embodiment.

As shown in FIG. 6, driver section 32R has a first group of control gate output lines CG1, CG3, CG5, and CG7, whereas driver section 32L has a second group of control gate output lines CG2, CG4, CG6, and CG8. These first and second groups of control gate output lines are positioned at the opposite sides of the memory cell section of EEPROM; they run in parallel with bit lines BL1 to BL256.

In each of NAND cell units associated with the corresponding bit line BLi (i=1, 2, ..., 256), control gate lines CGi1, CGi2, ..., CGi8 are alternately taken out of the memory cell section, and connected to the corresponding control gate output lines CG via either right-side transfer gate array 30R or left-side transfer gate array 30L. In other words, every other one is taken out of the control gates of an array of data storage transistors, e.g., memory cell transistors M, into the opposite sides of the memory cell section in such a manner that, in NAND cell unit U1, for example, control gate line SGD1 is taken out into the right side of the NAND cell unit and connected to a corresponding output line CG1 via transfer gate array 30R, the next control gate line SGD2 is taken out into the opposite side of the NAND cell unit, e.g., the left side, and connected to a corresponding output line CG2 via the other transfer gate array 30L, and still another control gate line SGD3 is taken out into the right side of the NAND cell unit and connected to a corresponding output line CG3 via transfer gate array 30R. Such arrangement results in the alternate wiring patterns of control gate line CGi1 to CGi8 shown in FIG. 6, wherein the first half control gate lines in ever NAND cell unit is associated with one driver section 32R via the first group of output lines, and the second half control gate lines is associated with the other driver section 32L via the second group of output lines.

Figure 8:
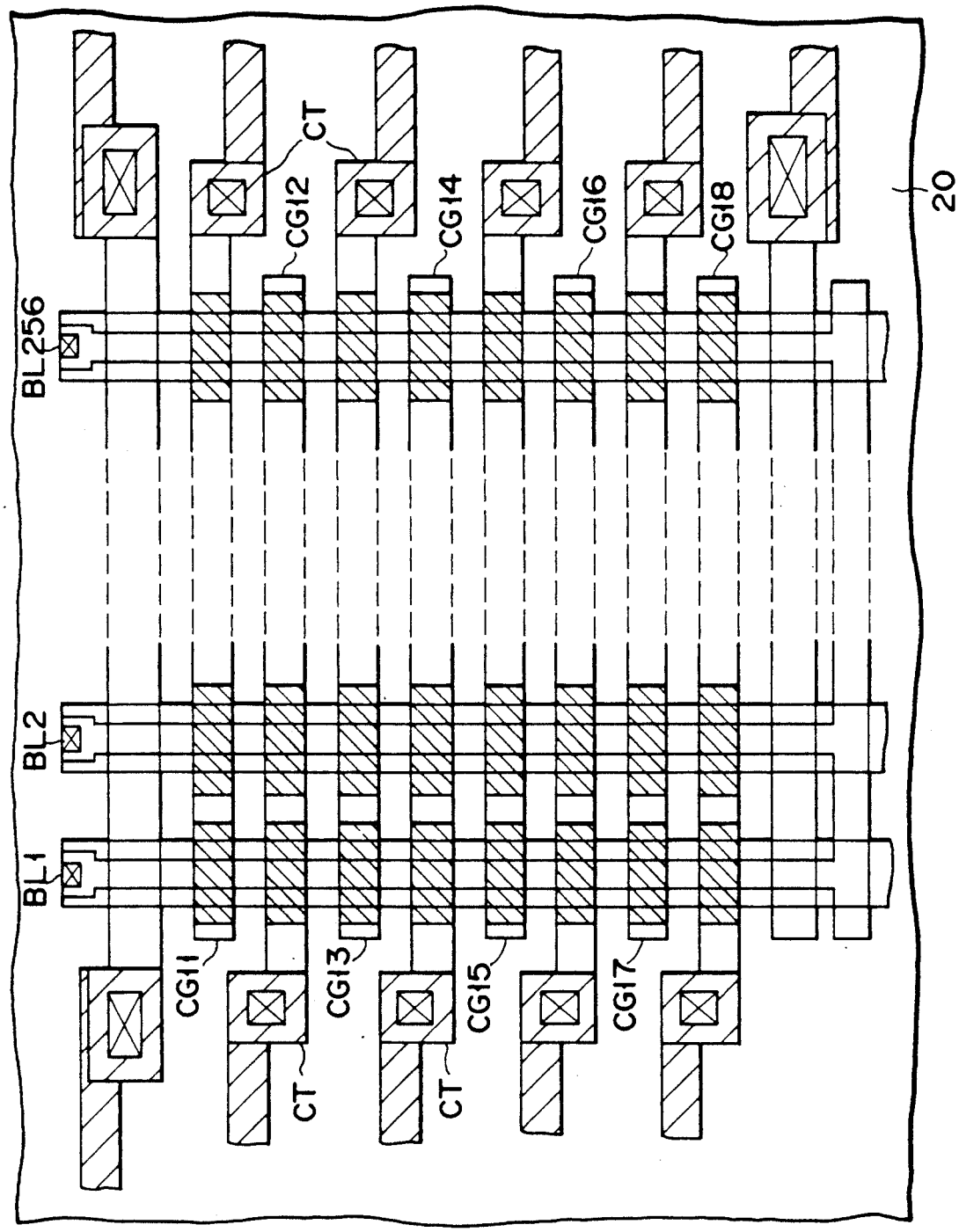
FIG. 8 is a diagram showing the practical plan view of the patterning layout of the NAND cell units shown in FIG. 6.

FIG. 8 shows a plan view of the actual wiring pattern layout of the NAND cell units of the EEPROM. It is easily understood by simply comparing this figure with FIG. 3 that the corresponding surface region in FIG. 8 can be greatly reduced in comparison with that shown in FIG. 3, thereby to improve the integration density of EEPROM. Such reduction in area is mainly due to the fact that contact portions CT for connecting control gate lines CG with the corresponding output lines CG1, CG3, CG5, CG7 (or CG2, CG4, CG6, CG8) of driver section 32R (32L) can be aligned linearly in parallel with bit lines BL, even when the same pattering rule is applied both in the aforementioned two embodiments. With the "alternate line take-out" feature of the embodiment shown in FIGS. 6 to 8, enough room can be obtained for every contact layer between a control gate line and an output line of either one of driver sections 32R or 32L on substrate 20. This enables the contact portions CT to be aligned along a line parallel with bit lines BL as shown in FIG. 8, whereby the entire occupation area required for such wiring lines containing contact sections CT can be compressed, so that chip area to be reserved for the memory cell section containing NAND cell units U can be increased successfully.

The operation modes of the EEPROMs of the present invention will now be described as follows. The data write/erase operation may be performed essentially under three different methods: the first method, the second method, and the third method. It will be demonstrated through the following description that the aforementioned "common driver" concept of the present invention can be used in NAND cell type EEPROMs designed to carry out data writing and erasing operations under any one of the three operating methods. It should be noted in the following description that all the memory cell transistors are the n-channel type ones.

According to the first method, releasing electrons stored in the floating gates of memory cell transistors into the substrate is defined as the "data writing" operation. If the EEPROM is designed to operate in accordance with the first method, a decoder circuit 22 thereof will be arranged as follows: when data is written into a desired cell transistor selected in a certain NAND cell unit, it generates an "L"-level voltage which is applied to the control gate CGi of the selected memory cell transistor, and which is also applied to the control gates of the cell transistors of the same NAND cell unit which transistors are positioned between the selected cell transistor and the corresponding bit line associated with this NAND cell unit, and an "H"-level voltage which is applied to this bit line. Under such a condition, the remaining cell transistors in the same NAND cell unit are being applied at their control gates with the "L"-level voltage; thus, "H"-level voltage is transferred to the drain of the selected cell transistor. With such application of the "H"- and "L"-level voltages, electrons are released from the floating gate 41 to substrate 20 in the selected cell transistor Mi, so that the threshold voltage value of this transistor is shifted to have the negative polarity; the "1" state may thus be obtained.

On the other hand, when data is erased, decoder circuit 22 generates and applies the "H"-and "L"-level voltages in such a manner described as follows. The "H"-level voltage is applied to the control gates of all the memory cell transistors constituting the NAND cell unit Ui, while the channels thereof are set to the "L"-level voltage potential. With such voltage application, electrons are injected from the channel region of the each NAND memory cell transistor M into the floating gate thereof. As a result, the threshold voltage value of NAND cell transistor Mi is shifted in the positive polarity direction; the "0" state may thus be obtained. With this technique, the above data erase may be simultaneously performed with respect to all the NAND cell transistors M, if required.

The second method is contrast with the first method in that injecting electrons into the floating gate is defined as the "data writing" operation. In erase mode, electrons are released from the floating gate 41 into the drain 46 of a certain NAND cell transistor. Such releasing of electrons will be repeated individually for every transistors in all the NAND cell units U until the threshold value of all the transistors is shifted into a certain value of negative polarity.

In write mode, an "H"-level voltage is applied to a target cell transistor selected from among those of a NAND cell unit Ui, while the remaining, non-selected cell transistors in this NAND cell unit are being applied with an intermediate voltage, which is high only enough to render these transistors conductive. At this time, the bit line associated with the NAND cell unit Ui is applied with an "L"-level voltage. As a result, carriers are injected from the channel region of the selected cell transistor into the floating gate 41 thereof, with the result in the threshold value being shifted along the positive polarity direction, whereby the "0" state may be obtained.

The third method is the method which is same as the second method in data writing technique, and different from the prior methods in that erase is performed such that an "L"-level voltage is applied to all the control gates of a NAND cell unit, while an "H"-level voltage of positive polarity is applied to the entire channel regions, thereby to provide what is called the "simultaneous erase."

Data reading may be performed in such a manner that of a selected cell transistor Mi in a NAND cell unit Ui is applied at the control gate thereof with an intermediate voltage having a specific potential level that is higher than the "L"-level voltage and lower than the "H"-level voltage. At this time, the remaining, non-selected cell transistors M1, M2, M(i-1), M(i+1), ..., M8 are applied with a specific voltage that is higher than the level-shifted threshold value along the positive polarity direction, thereby to provide a "threshold value-free" condition. Data stored in the selected cell transistor may be sensed and determined by detecting whether the selected cell transistor Mi is rendered conductive or kept nonconductive.

A detailed description with respect to the first method will be presented hereinafter. With the first method, row decoder 22 generates the "H"-level voltage, such as 20 volts, which is then applied to the control gates of all the memory cell transistors M in selected NAND cell unit Ui. The bit line associated with this NAND cell unit is applied with the "L"-level voltage (0 volts, for example). For example, only the selection gate SGD1 is designated by row decoder 22 and applied with a boosted voltage of the "H"-level potential; the remaining selection gate lines SGD2 through SGD4 are maintained at the "L"-level votage. Under such condition, the "H"-level voltage of the output signal of control gate drive circuit 32 shown in FIG. 1 is transmitted via transfer gate 30 only to a selected NAND cell containing the selected NAND cell unit U1 that is designated by selection gate line SGD1. As a result, all the memory cell transistors included in the selected NAND cell block are rendered conductive simultaneously, so that electrons are injected from substrate 20 into the floating gates thereof. The "simultaneous data erase" can thus be performed. The threshold value of the NAND cell transistors M is level-shifted in the positive polarity to provide the "0" state.

Data write is sequentially performed with respect to the cell transistors in a NAND cell unit Ui in such an order that the cell transistor Mi8 positioned most far from a node between this NAND cell unit and the corresponding bit line associated therewith, cell transistor M7 positioned adjacent to the transistor M8, and so on. In other words, in NAND cell unit U1, cell transistor M8 is first subjected to data writing. Cell transistor M7 is then subjected to writing. The remaining cell transistors M6, M5, M4, ... are sequentially subjected to data writing in this order. Data writing ends in NAND cell unit U1 when cell transistor M1, which is positioned most near to the corresponding bit line BL1, is subjected to data writing.

In the data writing mode, the bit line Bli is applied with a "H"-level voltage of 23 volts, for example. A 0-volt voltage is applied to the control gate line connected to the selected memory cell transistor Mi; the "H"-level voltage of 23 volts is applied to the remaining, non-selected cell transistors in this NAND cell unit, which are positioned between the selected cell transistor and the corresponding bit line associated with this NAND cell unit. 0-volt voltage will be applied to the control gate line that is connected to a memory cell transistor and the remaining non-selected cell transistors into which data has been written. With such a voltage application, the "H"-level voltage being applied to the bit line BLi may be transmitted to the drain of the selected cell transistor Mi, whereby electrons stored in the floating gate of the selected cell transistor is released to its drain, so that the "1" condition can be obtained wherein the threshold value is shifted along the negative polarity direction. Under this condition, memory cell transistors M1, M2, ..., M(i−1) positioned between the selected cell transistor Mi and the bit line BLi (or selection transistor SD) are set in the "neutral" state, since no electric field is created between the control gates 41 and substrate 20.

In the case of writing data "0," the intermediate voltage of 11.5 volts, for example, is applied to the bit line BLi associated with the selected NAND cell unit Ui. No "over erase" will occur at this time, for the following reasons: the memory cell transistors M1, M2, ..., M(i−1) positioned between the selected cell transistor Mi and the bit line Bli (or selection transistor SD) are set in a light "erase" mode; however, the electric field is so weak that the above condition will not lead to the "over erase" phenomenon under a condition wherein no data has been written therein. In the data write mode, the "H"-level voltage output by common control gate drive circuit 32 is supplied only to a specific NAND cell block containing the selected NAND cell unit Ui via a corresponding transfer gate 30, which has been selected and activated in response to the "H"-level voltage appearing on a selection gate line SGDi designated by row decoder 22.

Data readout may be carried out in such a manner that a read voltage, such as a 0-volt voltage, is applied to the control gate of a selected memory cell transistor Mi with the remaining cell transistors Mi1, M2, ..., M(i−1), M(i+1), ..., M8 in this NAND cell unit Ui being applied with 5-volt voltage. The data value may be sensed by detecting whether or not current flows in this NAND cell unit.

Figure 10:
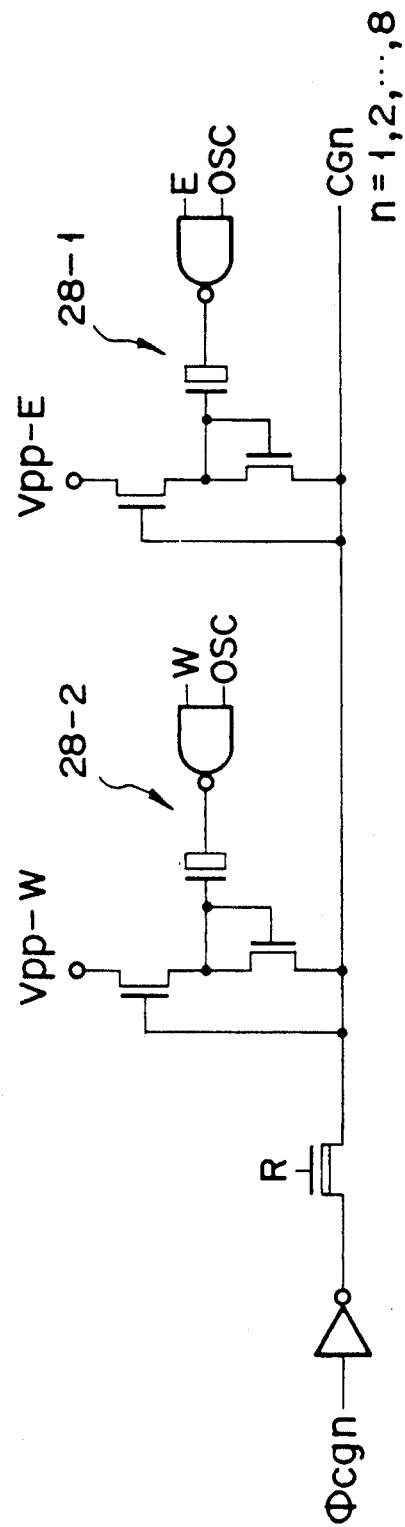
FIG. 10 is a diagram showing the internal circuit configuration of a voltage boost-circuit provided in the control gate drive circuit of FIG. 9.

The practical circuit configuration of control gate drive circuit 32 for performing the aforementioned several modes of operation is shown in FIGS. 9 and 10. The relationship of logical values among several main signals is shown in the following Table 1, in the case wherein output line CG5 of control gate drive circuit 32 is selected, and wherein signals XN1 and XN2 shown in FIG. 9 are the logical "H"-level signal, whereas signal XN3 is the "L"-level signal. Further, Table 2 that follows shows the operating relationship in voltage booster circuit shown in FIG. 10.

TABLE 1

|  | Read | Erase | Write |
|---|---|---|---|
| φcg1 | L | L | L |
| φcg2 | L | L | L |
| φcg3 | L | L | L |
| φcg4 | L | L | L |
| φcg5 | H | L | H |
| φcg6 | L | L | H |
| φcg7 | L | L | H |
| φcg8 | L | L | H |
| E | L | H | L |
| W̄ | H | H | L |
| φcg1' | L | — | — |
| φcg2' | L | — | — |
| φcg3' | L | — | — |
| φcg4' | L | — | — |
| φcg5' | H | — | — |
| φcg6' | L | — | — |
| φcg7' | L | — | — |
| φcg8' | L | — | — |

TABLE 2

|  | CGn | | |
|---|---|---|---|
| φcgn | Read | Erase | Write |
| L | Vcc | Vpp-E | Vpp-W |
| H | Vss | — | Vss |
| R | H | L | L |
| E | L | H | L |
| W | L | L | H |

When XN1=H, XN2=H, and XN3=L, erase signal E=L and Write signal W̄=H in the read mode. Outputs φcg1 to cg4 and φcg6 to φcg8 in the circuit shown in FIG. 9 are set to "L"-level voltage (Vss); while only the output φcg5 is set to power supply voltage Vcc. These voltages are inverted as shown in FIG. 10 and Table 2 and then supplied to control gate output line CGn, so that only the output line CG5 is set to the "L"-level voltage. With such voltage application, the aforementioned reading operation will be executed.

In the erase mode, it is set that E=H, W̄=H. Under this condition, all the control gate outputs φcg1 o. to φcg8 in FIG. 10 are set to the "L"-level; all the control gate output lines CG1 through CG8 are fixed to voltage Vpp-E (20 volts, for example) by voltage booster circuit shown in FIG. 10. As a result, the simultaneous erasing operation may be performed in the manner as described above.

In the write mode, it is set that W̄=L, E=L. Under this condition, outputs φcg1 to φcg4 in the circuit shown in FIG. 9 are set to the "L"-level voltage, and outputs φcg5 to φcg8 are set to "H"-level voltage (Vss). Output lines CG1 to CG4 are set to voltage Vpp-W (23 volts, for example) by voltage booster circuit 28-2 shown in FIG. 10, while the remaining output lines CG5 to CG8 are set to the "L"-level voltage, substrate voltage Vss, for example. With such a voltage application, the data writing may be performed with respect to a selected memory cell transistor Mi5 in NAND cell unit Ui that is selected by output line CG5 in the similar manner as described above.

A detailed description with respect to the second method will now be given as follows. The data read with the second method is same as that with the first method that is mentioned earlier. The sequential data erase in the second method is also same as that in the first method which is described above. It should be noted in the data erase mode that memory cell transistors M in a certain NAND cell unit Ui included in a NAND cell block that is specified by selection gate line SGD are sequentially subjected to data erasing, since the simultaneous erase is not available in the second method. In this case, the cell transistors Mi8, Mi7, Mi6, ..., Mi3, Mi2, and Mi1 are sequentially erased in this order.

Figure 12:
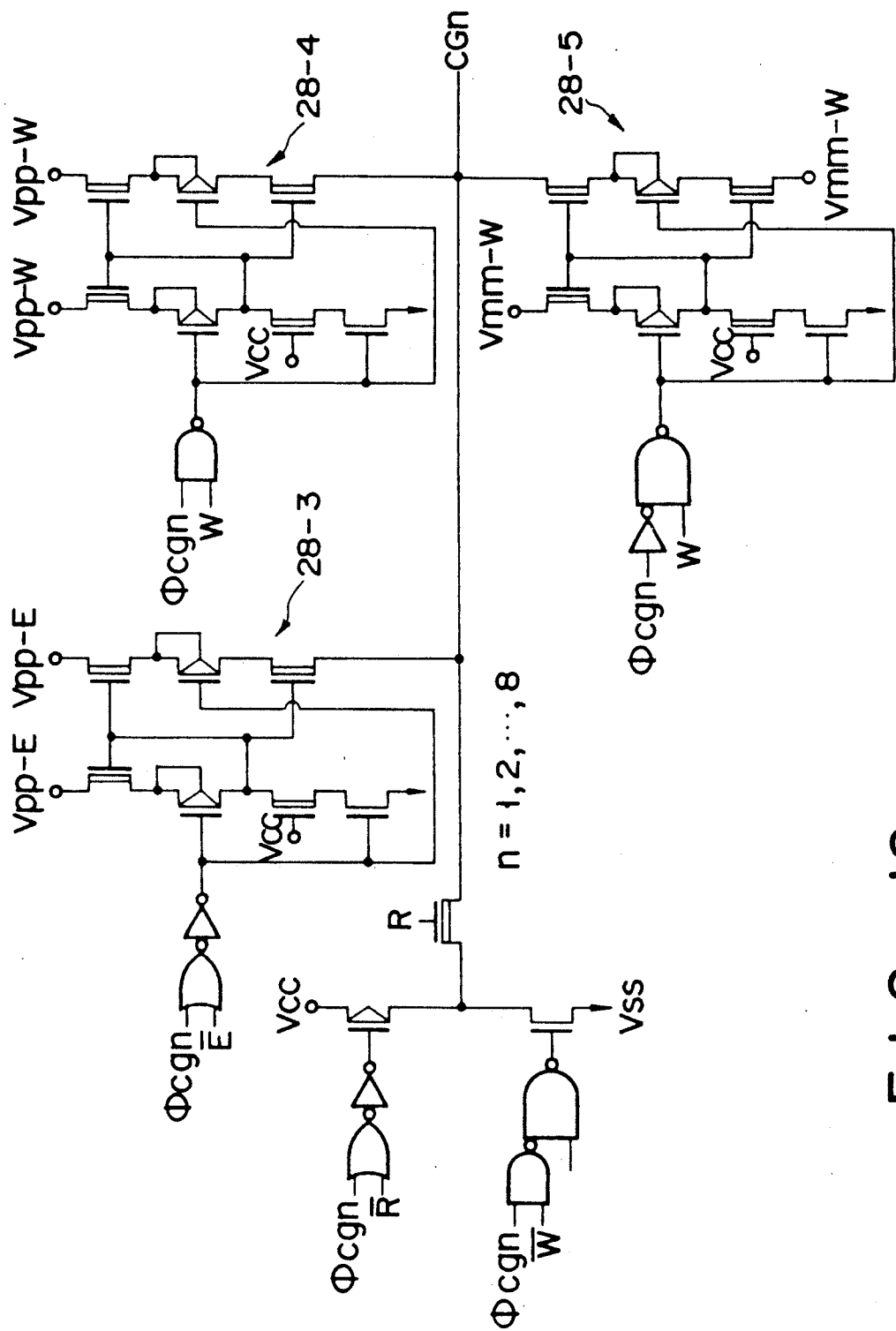
FIG. 12 is a diagram showing the internal circuit configuration of a voltage boost-circuit provided in the control gate drive circuit of FIG. 11.

In the data write mode, memory cell transistors M in a selected NAND cell unit Ui are sequentially subjected to data writing in such an order that the cell transistor Mi8, which is located most far from the corresponding bit line BLi, is first subjected to the data writing, and that the cell transistor Mi1, which is located most near to the corresponding bit line BLi, is lastly subjected to the data writing. At this time, the "H"-level voltage, which is boosted to have 20 volts, for example, is applied to the control gate of a desired memory cell transistor being selected in the NAND cell unit Ui, while the remaining control gates are being applied with an intermediate voltage of 10 volts, for example. To write logical data "1," electrons are injected into the floating gate of the selected cell transistor by applying the bit line BLi with 0-volt voltage. On the other hand, in order to write loglcal data "0," a voltage of 10 volts is applied to the bit line BLi. Under suoh condition, the selected cell transistor will be set in a weak electron-injection mode; however, the threshold value thereof will not be sifted, since that electric field is so weak. The practical circuit configuration of control gate drive circuit 32 for performing the aforementioned several modes of operation is shown in FIGS. 1 and 12. The relationship of logical values among several main signals is shown in the following Table 3, in the case wherein output line CG5 of control gate drive circuit 32 is selected, and wherein signals XN1 and XN2 shown in FIG. 9 are the logical "H"-level signal, whereas signal XN3 is the "L"-level signal. Further, Table 4 that follows shows the operating relationship in voltage booster circuit shown in FIG. 12.

TABLE 3

|  | Read/Write | Erase |
| --- | --- | --- |
| φcg1 | L | L |
| φcg2 | L | L |
| φcg3 | L | L |
| φcg4 | L | L |
| φcg5 | H | H |
| φcg6 | L | H |
| φcg7 | L | H |
| φcg8 | L | H |
| E | H | L |
| φcg1' | L | — |
| φcg2' | L | — |
| φcg3' | L | — |
| φcg4' | L | — |
| φcg5' | H | — |
| φcg6' | L | — |
| φcg7' | L | — |
| φcg8' | L | — |

TABLE 4

| | CGn | | |
| --- | --- | --- | --- |
| φcgn | Read | Erase | Write |
| L | Vcc | Vpp-E | Vmm-W |
| H | Vss | Vss | Vpp-W |
| R(R̄) | H(L) | L(H) | L(H) |
| E | H | L | H |
| W(W̄) | L(H) | L(H) | H(L) |

When XN1=H, XN2=H, and XN3=L in the read mode, output lines CG1 to CG4, and CG6 to CG8 are set to power supply voltage Vcc, while output line CG5 is maintained at substrate voltage Vss. With such voltage application, the same operation as described above with reference to the first method will be executed.

In the erase mode, it is set that E=L, W=L. Under this condition, outputs φcg1 to φcg4 are set to the "L" level, whereas outputs φcg6 to φcg8 are set to the "H" level in FIG. 11. Control gate output lines CG1 to CG4 are set by voltage booster circuit 28-3 shown in FIG. 12 to the voltage Vpp-E (23 volts, for example). At the same time, output lines CG5 to CG8 are set by the same voltage booster circuit 28-3 shown in FIG. 12 to 0-volt voltage. As a result, a 0-volt voltage is applied to the control gate lines connected with memory cell transistors of selected NAND cell unit Ui which are positioned between the selected cell transistor and the corresponding bit line BLi; a 23-volt voltage is applied to the remaining control gate lines connected with memory cell transistors of selected NAND cell unit Ui which are positioned between the selected cell transistor and the second selection transistor SS, whereby the erase operation may be performed in the manner as described above.

Figure 11:
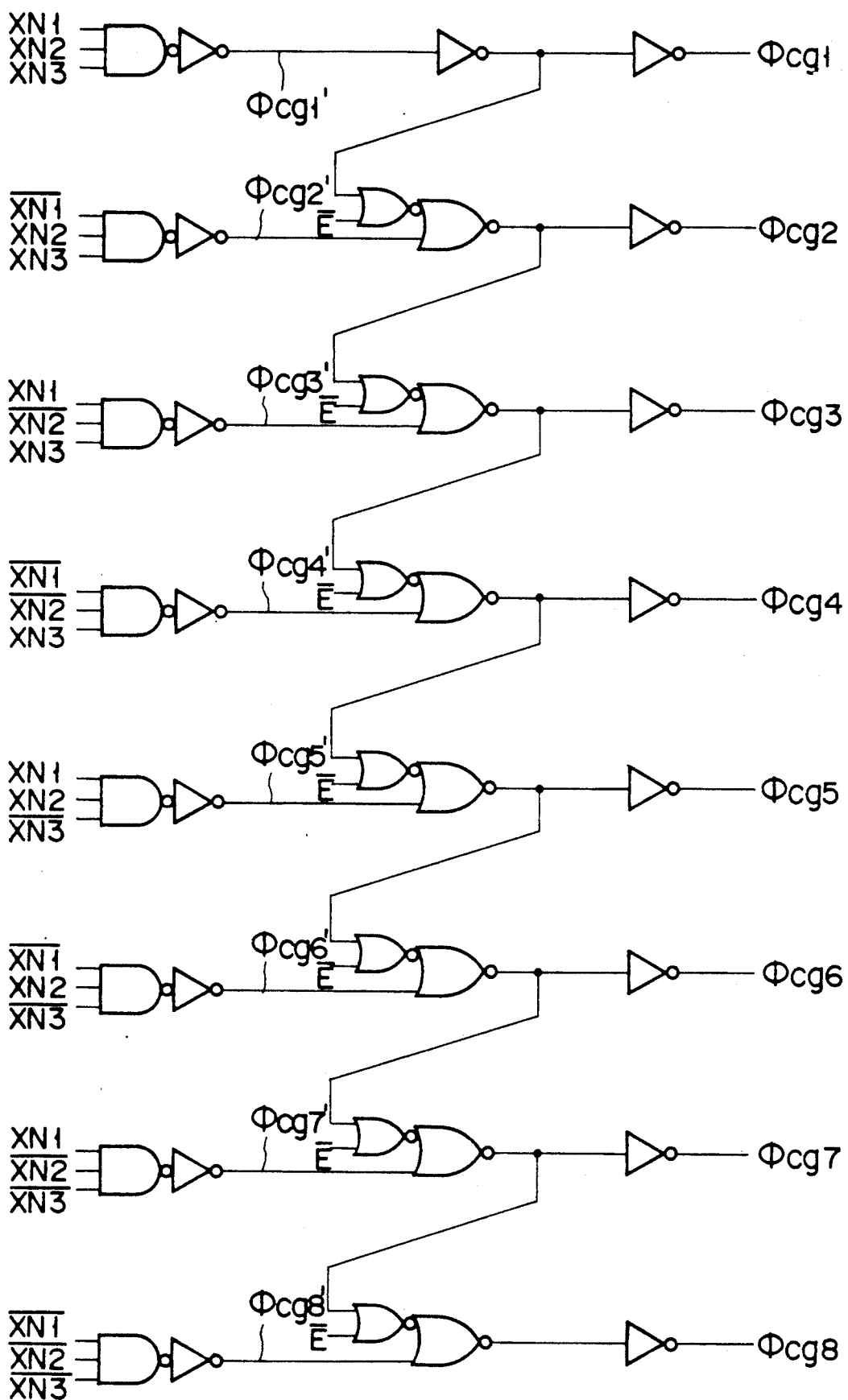
FIG. 11 is a diagram showing the equivalent circuit configuration of a, control gate drive circuit that is preferably used to operate in accordance with the second possible data accessing method.

In the write mode, it is set that W=H, E=H. Under this condition, output φcg5 of the circuit shown in FIG. 11 is set to the "H"-level voltage; the remaining outputs are set to the "L"-level voltage. Output lines CG1 to CG4, and CG6 to CG8 are set to the intermediate voltage Vmm-W (10 volts, for example) by voltage booster circuit 28-5 shown in FIG. 12. At this time, only the output line CG5 is set to the voltage Vpp-W (20 volts, for example). With such a voltage application, the data writing may be performed with respect to a selected memory cell transistor Mi5 in NAND cell unit Ui that is selected by output line CG5 in the similar manner a described above.

Lastly, a detailed description will then given of the third method. The data read and write in the third method is same as those of the second method that is mentioned above. The data erase in the third method is a simultaneous data erase in which a high-level voltage is given to a substrate surface section located beneath the channel regions of all the NAND memory cell transistors M, whereby electrons are released from all the floating gates to substrate 20 simultaneously.

Figure 13:
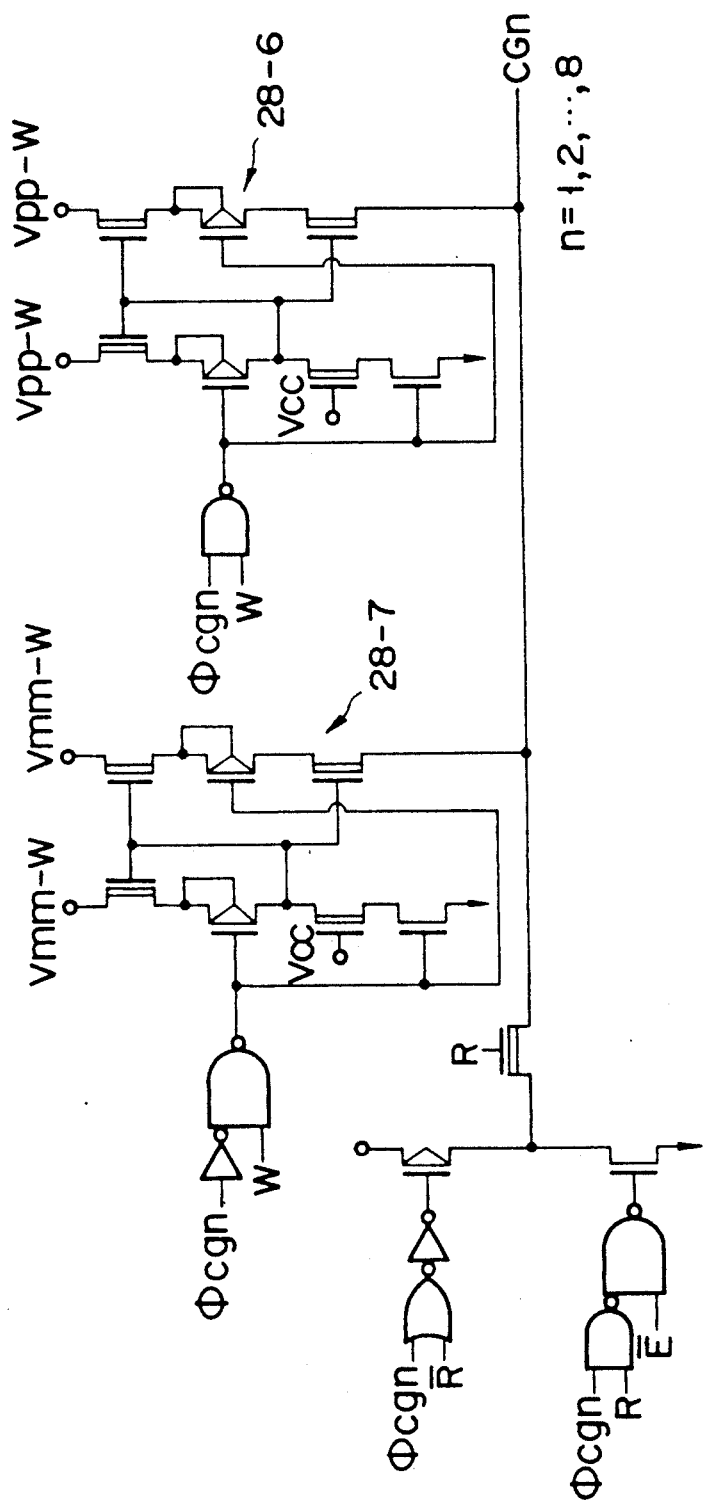
FIG. 13 is a diagram showing the equivalent circuit configuration of a control gate drive circuit that is preferably used to operate in accordance with the third possible data accessing method.

The practical circuit configuration of control gate drive circuit 32 for performing the aforementioned operation modes is shown in FIG. 13. This circuit includes voltage boost circuit sections 28-6 and 28-7, which are respectively corresponded to voltage booster circuits 28-4 and 28-5 shown in FIG. 12. The relationship of logical values among several main signals is shown in the following Table 5.

TABLE 5

| | CGn | | |
| --- | --- | --- | --- |
| φcgn | Read | Erase | Write |
| L | Vcc | Vss | Vmm-W |
| H | Vss | Vss | Vpp-W |
| R(R̄) | H(L) | L(H) | L(H) |
| E | H | L | H |
| W | L | L | H |

The data write may be performed in a similar manner as in the second method: voltages Vpp-W and Vmm-W are selectively applied by voltage booster circuits 28-7 and 28-8 to control gate lines, thereby to cause electrons to be injected from substrate 20 into the floating gate in a selected cell transistor Mi. Data erase may be carried out by applying all the control gate lines CGn with a "L"-level voltage, so that a substrate section beneath the channel region is applied with a high voltage.

According to the present invention, control gate drive circuit 32 is provided in common with respect to a plurality of control gate lines among NAND cell units U: the "common control gate drive circuit 32 is connected to those lines via transfer gate arrays 30 each of which is associated with a corresponding NAND cell unit. Switching in transfer gates 30 enables the common control gate drive circuit 32 to work only with selected control gate lines CG that are respectively designated from NAND cell units associated with a corresponding bit line BLi. With such the "common driver" feature, the surface area required for the control gate driving circuit and signal transmission lines between the memory cell section and the control gate driving circuit can be greatly decreased, thereby increase an effective memory cell area on chip substrate 20 of the fixed size. This fact can contribute to improvement in the total data storage capacity of highly integrated EEPROM of NAND cell structure.

Furthermore, according to the present invention, the common driver circuit 32 can be located in the peripheral surface region that is adjacent to the memory cell block containing a number of NAND cell units, after control gate output lines CG1 to CG8 which run in parallel with bit lines BL are used to provide electrical connection between NAND cell units and the common driver circuit 32. This enables the layout rule for the memory cell blocks containing NAND cell units to be greatly expanded in its flexibility; the memory cell occupation area on chip substrate 20 can thus be increased and freely arranged as needed without increasing the size of chip substrate 20.

Very importantly, the common control gate driver 32 may be subdivided into two sections 32R and 32L as in the second embodiment of the present invention shown in FIG. 6. In this case, it can be expected in the EEPROM that the memory integration density is maximized due to the compact layout of wiring lines for connecting the control gate lines CG of NAND cell transistors M with the common driver circuits 32R and 32L, which has been explained with reference to FIG. 8. Increasing in the efficiency of using substrate surface area for NAND cell arrays can maximize the integration density of NAN cell type EEPROM.

Figure 14:
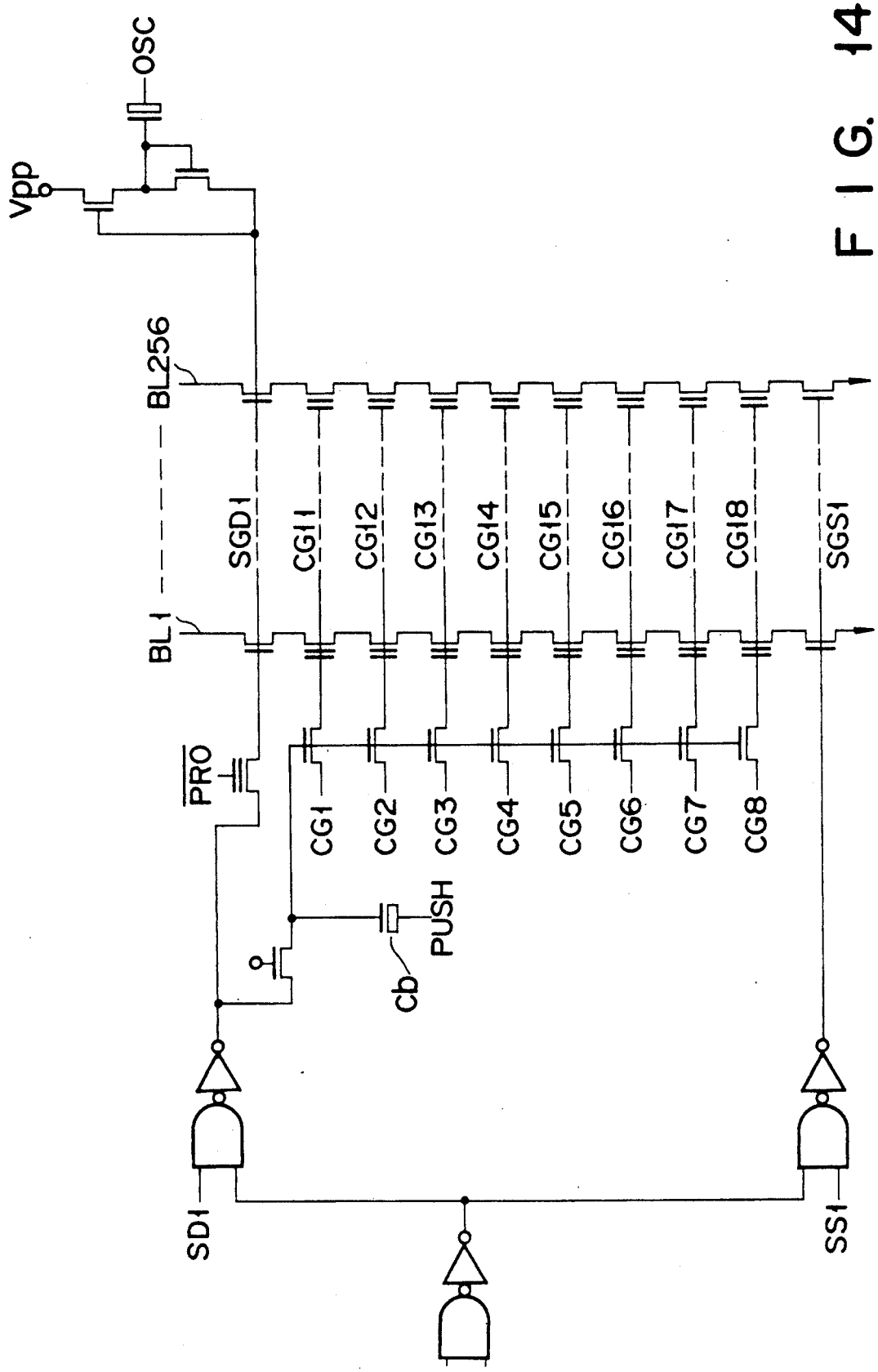
FIG. 14 is a diagram showing the modified internal circuit configuration of one of the NAND cell units of the EEPROM shown in FIG 6.

Although the present invention has been described with reference to particular embodiment presented above, the invention should not be limited only to the above embodiments and can be modified variously by those skilled in the art to which the invention pertains. For example, in the aforementioned embodiments, transfer gates 30 are formed of D type MOSFETs; E type MOSFETs, however, may be used therefor, if required to do so. A circuit configuration suitable for that case is shown in FIG. 14. When E type MOSFETs are used in transfer gates 30, the outputs of control gate driver circuit 32 will be dropped by a potential level corresponding to the threshold value of those transistors used in transfer gates 30. With the circuit shown in FIG. 14, voltage compensation capacitor Cb is additionally provided to compensate for such voltage drop by boosting the control voltage in the corresponding transfer gate.

In the above embodiments, NAND memory cell transistors M are floating gate type MOSFETs; however, MNOS type memory cell transistors may also be used in the EEPROMs in accordance with the present invention.

It should be noted that the common driver circuit 32 may be modified so that it is divided into a plurality of separate driver sections, although the driver circuit 32 can work in common for the entire memory cell section of EEPROM. Various dividing methods may be considered by those skilled in the art; for example, the entire memory cell section is divided into a predetermined number of square-shaped memory subsections, each of which is provided with an independent control gate driver circuits. Alternatively, the memory cell section on chip substrate 20 is divided into a series of memory subsections that are aligned a predetermined direction; each memory subsection is provided with independently operating control gate driver sections. Below is a detailed description concerning two possible modified EEPROMs with reference to FIGS. 15 and 16.

Figure 15:
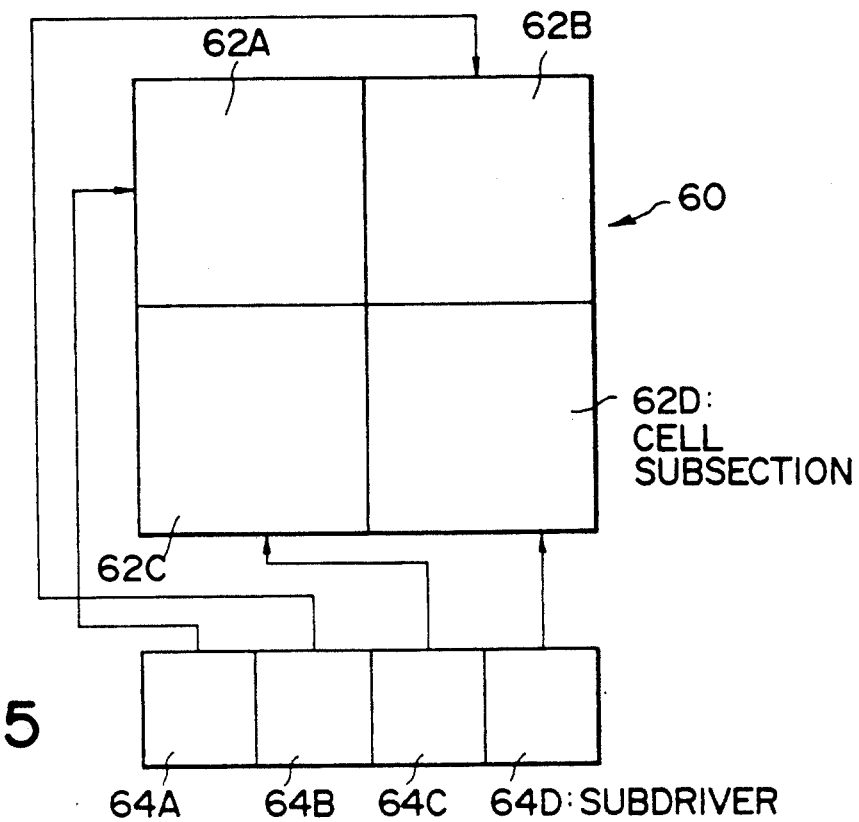
FIGS. 15 and 16 are diagrams showing some possible modifications of the present invention.
Figure 16:
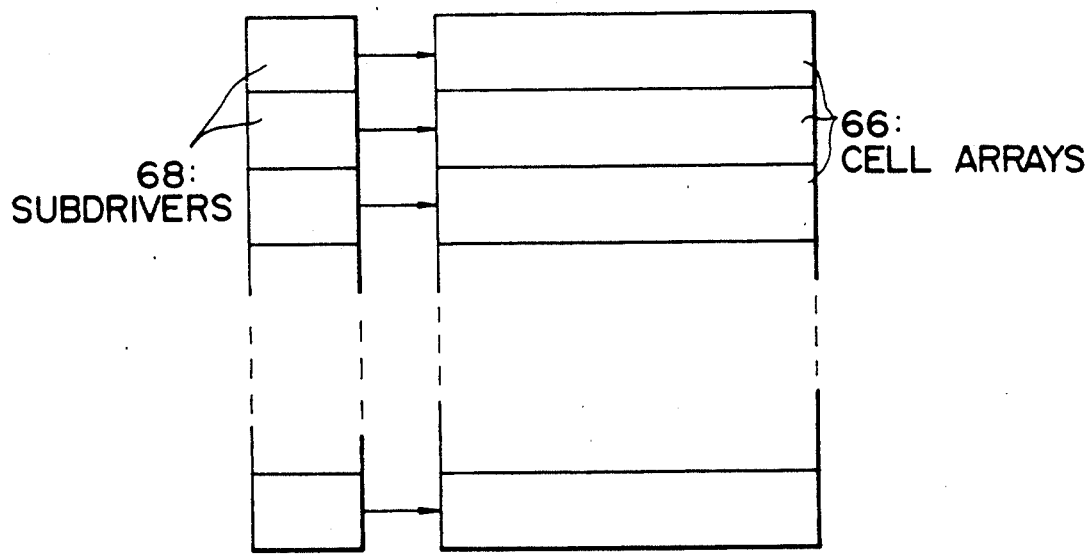

According to the embodiment shown in FIG. 15, memory cell section 60 is subdivided into four square-shaped memory subsections 62A, 62B, 62C, and 62D, each of which includes a preselected number of arrays of NAND cell units. Four control gate driver circuits 64A, 62B, 64C, and 64D are provided and associated with memory subsections 62A, 62B, 62C, and 62D, respectively. On the other hand, according to the other embodiment shown in FIG. 16, the memory cell section 60 is subdivided into a number of cell arrays 66, which are linearly aligned along the bit lines' extending direction on a chip substrate (not shown in FIG. 16). With any one of these arrangement, each of driver sections 64 or 68 can be lightened in its control gate driving workload, which will improved the data accessing performance and the operating speed of the EEPROMs.

What is claimed is:

1. A non-volatile semiconductor memory device comprising:
    a substrate;
    parallel data transmission lines formed above said substrate;
    a memory cell section including an array of NAND type cell units associated with a corresponding one of said data transmission lines;
    each of said NAND type cell units having a series-circuit of a preselected number of data storage transistors with control gates and a switching transistor; and
    a control gate driver circuit formed on said substrate and provided in common for a plurality of certain NAND type cell units specified from among said NAND type cell units associated with the corresponding data transmission line.

2. The device according to claim 1, wherein each of said data storage transistors has a carrier storage layer insulatively provided above said substrate, and wherein said switching transistor has a selection gate and is provided between said series-circuit of data storage transistors and a corresponding data transmission line.

3. The device according to claim 2, wherein said control gate driver circuit is connected in common with said NAND type cell units associated with the same data transmission line.

4. The device according to claim 3, further comprising:
    transfer gate means provided between said NAND type cell units and said control gate driver circuit, for selectively connecting corresponding ones of the control gates of said NAND type cell units with said control gate driver circuit, said corresponding ones including control gates each of which is selected from different NAND type cell units which are associated with the same data transmission line.

5. The device according to claim 4, wherein said transfer gate means is connected to the selection gate of said switching transistor.

6. The device according to claim 5, wherein said control gate driver circuit comprises:
    a first driver section positioned on one side of said memory cell section; and
    a second driver section positioned on the other side of said memory cell section.

7. The device according to claim 6, wherein said transfer gate means comprises:
    a first transfer gate section positioned on one side of said memory cell section and connected to said first driver section; and
    a second transfer gate section positioned on the other side of said memory cell section and connected to said second driver section.

8. The device according to claim 7, further comprising:
    a first group of control gate output lines connected with said first transfer gate section and said first driver section; and
    a second group of control gate output lines connected with said second transfer gate section and said first driver section.

9. A programmable read-only memory comprising:
    a semiconductive substrate;
    bit lines insulatively formed above said substrate;

word lines formed above said substrate to intersect with said bit lines to have cross points therebetween;

rewritable memory cell transistors provided at the cross points, said memory cell transistors being grouped in NAND cell units each of which has a preselected number of memory cell transistors, said memory cell transistors comprising control gates and data storage layers;

switch means provided for cell units, for selectively connecting said sell units to the corresponding bit lines;

row decoder means connected to said word lines and said switch means, for selectively designating one or some of said word lines as selected lines by generating a predetermined level of voltage;

controller means for controlling said memory cell transistors so that each transistor is rendered conductive independently of the remaining cell transistors in a selected one of said NAND cell units, said controller means having outputs and being associated with said NAND cell units so that mutually corresponding control gates of memory cell transistors, which belong to different NAND cell units associated with a certain bit line, are connected together to one of said outputs of said controller means; and transfer gate means provided between said NAND cell units and said controller means, for selectively allowing a desired one of said mutually corresponding control gates to be connected to said controller means, while the other of said mutually corresponding control gates are electrically disconnected from said controller means.

10. The memory according to claim 9, further comprising:
wiring lines provided in parallel with said bit lines, for connecting said NAND cell units with said controller means on said substrate.

11. The memory according to claim 10, wherein said controller means comprises a gate controller circuit which is positioned adjacent to said NAND cell units on said substrate.

12. The memory according to claim 10, wherein said NAND cell units are formed in a memory cell section on said substrate, and wherein said controller means comprises:
a first gate controller circuit located on one side of said memory cell section; and
a second gate controller circuit located on the opposite side of said memory cell section on said substrate.

13. The memory according to claim 12, wherein said first gate controller circuit is associated with control gates of first memory cell transistors, while said second gate controller circuit is associated with control gates of second memory cell transistors in each NAND cell unit, said first and second memory cell transistors being arranged alternately in each NAND cell unit.

14. The memory according to claim 13, wherein said wiring lines comprise:
a first group of wiring lines arranged on one side of said memory cell section and associated with said first gate controller circuit; and
a second group of wiring lines arranged on the opposite side of said memory cell section and associated with said second gate controller circuit.

* * * * *